(12) United States Patent
Anzai et al.

(10) Patent No.: US 7,183,125 B2
(45) Date of Patent: *Feb. 27, 2007

(54) METHOD FOR MANUFACTURING SURFACE ACOUSTIC WAVE DEVICE

(75) Inventors: Tatsuya Anzai, Kouza-gun (JP); Yuji Ogawa, Kouza-gun (JP); Yasuhide Onozawa, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/559,238

(22) PCT Filed: Jun. 1, 2004

(86) PCT No.: PCT/JP2004/007900

§ 371 (c)(1),
(2), (4) Date: Dec. 1, 2005

(87) PCT Pub. No.: WO2004/109912

PCT Pub. Date: Dec. 16, 2004

(65) Prior Publication Data

US 2006/0150381 A1    Jul. 13, 2006

(30) Foreign Application Priority Data

Jun. 3, 2003 (JP) .............................. 2003-157888

(51) Int. Cl.
*H01L 21/00* (2006.01)
*H01L 41/00* (2006.01)

(52) U.S. Cl. .................. 438/22; 438/50; 257/416; 257/E21.503; 257/E21.499; 310/313 R

(58) Field of Classification Search .................. 438/22, 438/50; 257/416; 310/313 R, 311
See application file for complete search history.

(56) References Cited

U.S. PATENT DOCUMENTS 6,543,109 B1 * 4/2003 Taga .......................... 29/25.35

(Continued)

FOREIGN PATENT DOCUMENTS

JP    06-093427    4/1994

(Continued)

*Primary Examiner*—Long Tran
(74) *Attorney, Agent, or Firm*—Koda & Androlia

(57) ABSTRACT

To provide a high quality SAW device with enhanced productivity, wherein an outer face of a SAW chip mounted on a mounting substrate is covered with a heat-softened resin sheet and resin is filled on the SAW chip to form an airtight space below an IDT in the SAW device. A method for manufacturing the SAW device includes: a step of flip-chip mounting the SAW chip on the mounting substrate, a step of placing the resin sheet on an upper face of the SAW chip; a laminating step of setting ambient environment to pressure-reduced or vacuum atmosphere and covering the outer face of the SAW chip with resin while securing the airtight space by pressurizing the resin sheet while heating the resin sheet; a press forming step of curing the resin while maintaining the airtight space by maintaining pressurized and heated state in the laminating step; and a post-curing step of performing heating at a temperature and for a time in which the resin completely cures, wherein a thickness tr of the resin sheet before the laminating step satisfies an equation of $$L/\{(X+Gx)(Y+Gy)\} \leq tr.$$

24 Claims, 8 Drawing Sheets

U.S. PATENT DOCUMENTS

| | | | |
|---|---|---|---|
| 6,670,206 B2 * | 12/2003 | Kim et al. | 438/26 |
| 2003/0164529 A1 * | 9/2003 | Inoue et al. | 257/414 |
| 2004/0239449 A1 * | 12/2004 | Stelzl et al. | 333/187 |
| 2006/0053607 A1 * | 3/2006 | Onozawa | 29/25.35 |

FOREIGN PATENT DOCUMENTS

| | | |
|---|---|---|
| JP | 10-022763 | 1/1998 |
| JP | 10-215142 | 8/1998 |
| JP | 10-321666 | 12/1998 |
| JP | 2002-151531 | 5/2002 |
| JP | 2002-184884 | 6/2002 |
| JP | 2002-217219 | 8/2002 |
| JP | 2002-217220 | 8/2002 |
| JP | 2002-314234 | 10/2002 |
| JP | 2002-334954 | 11/2002 |
| JP | 2003-017979 | 1/2003 |
| JP | 2003-032061 | 1/2003 |
| JP | 2003-158436 | 5/2003 |

* cited by examiner (a)

(b)

(a)

(b)

(c)

METHOD FOR MANUFACTURING SURFACE ACOUSTIC WAVE DEVICE

This application is a 371 of PCT/JP04/07900 filed on Jun. 01, 2004.

TECHNICAL FIELD

The present invention relates to a surface acoustic wave device, and in particular to a surface acoustic wave device with reduced package size and a method for manufacturing the device.

BACKGROUND ART

In recent years, a surface acoustic wave (hereinafter, "SAW") device is widely used in a field of mobile communications, and it is often used for portable phones or the like especially because of its excellent features such as high performance, size reduction, and mass productivity. Along with generalization of small size packaging called CSP (Chip Size Package) in semiconductor parts, a resin sealing method utilizing the CSP technique is introduced in view of facilitation of reduction in the device size and an improvement in productivity according to a batch type manufacturing method in the SAW device.

As a SAW device utilizing the CSP technique, there are structures disclosed in JP-A No. 2002-184884, JP-A No. 2002-217219, JP-A No. 2002-217220, and JP-A No. 2002-314234 (hereinafter, these structures are called "conventional technology 1"). FIG. 10 illustrates a structure of the CSP type SAW device disclosed in the conventional technology 1. The SAW device shown in FIG. 10 includes a SAW chip 103 having an IDT for oscillating a SAW and electrode pads arranged on a main face 103a of a piezoelectric substrate positioned on a lower side in FIG. 10, and a mounting substrate 101 having connection pads 102 arranged on a main face 101a positioned on an upper side in FIG. 10. The electrode pads provided on the lower face of the SAW chip 103 and the connection pads 102 provided on the mounting substrate 101 are conductively fixed to each other via metal bumps 104, and a main face 103b of the SAW chip 103 positioned on an upper side in FIG. 10 and side faces thereof are covered with a resin sheet 105 such that the main face 103b comes in close contact with the side faces so that an airtight space 106 is formed between the face 103a and the face 101a.

A method for manufacturing the SAW device will be explained below. After the SAW chip 103 and the mounting substrate 101 are flip-chip mounted, the resin sheet 105 is placed on the SAW chip 103, and the resin sheet is heated up to a resin softening temperature, so that the resin sheet 105 is deformed to come in close contact with the surface of the SAW chip 103 and the mounting substrate 101 in conformity with contours thereof. After the resin sheet 105 is deformed, further heating is conducted to impart fluidability to the resin sheet 105, so that the resin sheet is caused to adhere to the SAW chip 103 and the mounting substrate 101, and the shape of the resin sheet 105 is fixed by curing the resin sheet. A shrinking force is generated when the resin sheet 105 is cured, so that it serves to press the SAW chip 103 toward the mounting substrate 101. Thus, the resin sheet 105 is brought in close contact with the SAW chip 103 and the mounting substrate 101 more tightly. In the conventional technology, since the shape of the resin sheet 105 can easily be deformed to conform with an outer face of the SAW chip, the SAW chip can be sealed without affecting operation of the SAW chip.

In the conventional technology 1, however, since an area of the upper face of the SAW chip 103 is small relative to the mounting substrate 101, it is difficult to effect marking for filter identification and conduct sucking for device pickup, and there is a problem of fragility, poor moisture resistance, or the like due to a structure in which the thin resin sheet 105 is merely brought in close contact with the SAW chip 103 in conformity with the outer face thereof. Further, since the resin sheet 105 is brought in close contact with the SAW chip 103 by applying a temperature gradient to the resin sheet 105 to generate shrinking force in the resin sheet, corners A at the SAW chip 103 become thin, so that the SAW chip 103 may be exposed externally, which may deteriorate the quality of the SAW chip 103.

Furthermore, another example of a manufacturing method is disclosed in JP-A No. 2002-217218 (hereinafter, "conventional technology 2"). As shown in FIG. 11, in the method, a resin sheet 105 is brought in close contact with an inner wall 200a tightly to deform the resin sheet 105 by providing a jig 200 with a shape conforming with a contour of a SAW chip 103 and sucking air through a hole 201a of a suction pipe 201. Thereafter, the jig 200 is disposed on the SAW chip 103 and the resin sheet 105 is caused to adhere to the SAW chip 103 and the mounting substrate 101 such that the resin sheet 105 is brought in close contact with surfaces of the SAW chip 103 and the mounting substrate 101, while the resin sheet 105 is heated. In the conventional technology 2, since the shape of the resin sheet 105 is deformed in advance so as to conform with surface shapes of the SAW chip 103 and the mounting substrate 101 by the jig 200, the SAW chip and the mounting substrate can be covered securely.

In the conventional technology 2, since the resin is brought in close contact with the SAW chip after the shape of the resin is deformed, a possibility that corners on an upper face of the SAW chip are exposed is reduced. However, the problem of fragility, poor moisture resistance, or the like due to thinness of the resin film and other problems of difficulties in working for marking or device pickup can not be addressed like the conventional technology 1. Furthermore, since resin sealing is performed using the jig, it is necessary to prepare jigs corresponding to respective sizes of the SAW chips, which deteriorates the working efficiency.

Furthermore, as another conventional technology, there is a structure disclosed in JP-A No. 2002-334954 (hereinafter, "conventional technology 3"). This structure corresponds to a structure in which an electrically conductive film layer is further formed on the resin sheet 105 in the structure of the SAW device shown in FIG. 10. In the conventional technology 3, since the electrically conductive film layer is formed on the resin, the moisture resistance is improved, but the problems as in the conventional technologies 1 and 2 such that the resin sheet is fragile due to its thinness and difficulties in working for marking and device pickup are not yet solved.

The present invention has been achieved in order to solve the above problems, and an object thereof is to provide a method for manufacturing a SAW device in which a SAW chip is flip-chip mounted on a mounting substrate and surfaces of the SAW chip and the mounting substrate are sealed with resin, wherein the SAW chip is firmly protected and quality of the SAW device is improved.

DISCLOSURE OF THE INVENTION

In order to achieve the above object, according to the first aspect of the present invention, there is provided a method for manufacturing a surface acoustic wave (SAW) device in which a surface acoustic wave chip is flip-chip mounted on a mounting substrate and an airtight space is formed by sealing an outer face of the SAW chip using resin, comprising:

a step of flip-chip mounting an electrode pad provided on the SAW chip and a connection pad provided on the mounting substrate using a conductive bump;

a step of placing a resin sheet on an upper face of the SAW chip mounted on the mounting substrate;

a laminating step of disposing, in a closed container, the mounting substrate on which the SAW chip is mounted and which has the resin sheet mounted on the upper face of the SAW chip, and covering the outer face of the SAW chip while securing the airtight space by pressurizing the resin sheet while heating the resin sheet;

a press forming step of curing the resin while maintaining the airtight space by maintaining pressurized and heated state in the laminating step; and a post-curing step of performing heating at a temperature and for a time in which the resin completely cures, wherein in the laminating step, the closed container is partitioned to at least two spaces by a partitioning member, the mounting substrate on which the SAW chip is mounted and which has the resin sheet placed on the upper face of the SAW chip is disposed in a first space of the at least two spaces, and atmosphere in the first space is maintained in a pressure-reduced or vacuum state, and the resin sheet is pressurized toward the mounting substrate by applying a pressure from the side of a second space of the at least two spaces to press the partitioning member toward the first space side, and a thickness tr of the resin sheet in the laminating step satisfies an equation of $$L/\{(X+Gx)(Y+Gy)\} \leq tr, \text{ where}$$

$$L=(X+Gx)(Y+Gy)(H+T+A)-XYT-XYA-\{XV_yA+V_xA+(4V_xV_yA)/3\},$$

in which L represents a volume of a resin sheet required for sealing an outer face of one SAW chip, X represents a length of one side of a SAW chip, Y represents a length of another side of the SAW chip, Gx represents a spacing between SAW chips adjacent to each other in X direction, Vx represents a distance from a dicing margin extending in Y direction to a side face of a SAW chip nearest thereto, Gy represents a spacing between SAW chips adjacent to each other in the Y direction, Vy represents a distance from a dicing margin extending in the X direction to a side face of a SAW chip nearest thereto, H represents a thickness of resin positioned on an upper face of a SAW chip after an outer face of one SAW chip is covered with a resin sheet, T represents a thickness of a piezo electric substrate, and A represents a spacing from an upper face of a mounting substrate to a bottom face of the piezoelectric substrate.

According to the second aspect of the present invention, the resin sheet has a structure in which a protective film with releasing property has been adhered onto an upper face of a sticky resin sheet member, the respective steps are conducted in a state that a lower face of the resin sheet member is placed on the upper face of the SAW chip, and the protective film is peeled off before the post-curing step or after the post-curing step.

According to the third aspect of the present invention, the protective film is made from polyethylene terephthalate (PET).

According to the fourth aspect of the present invention, the laminating step includes procedures of: (1) after placing the resin sheet on the SAW chip mounted on the mounting substrate, placing it in a closed container; and (2) after the procedure (1), evacuating gas in the closed container to make the closed container become a pressure-reduced or vacuum state and pressurizing the resin sheet while softening or melting the resin sheet.

According to the fifth aspect of the present invention, the laminating step includes procedures of: (1) after placing the mounting substrate mounted with the SAW chip in a closed container, adhering the resin sheet onto the upper face of the SAW chip; and (2) after the procedure (1), evacuating gas in the closed container to make the closed container become a pressure-reduced or vacuum state and pressurizing the resin sheet while softening or melting the resin sheet.

According to the eighth aspect of the present invention, pressurization of the resin sheet is performed in the laminating step until the resin sheet is gelated, that is, the pressurizing is performed after the resin sheet is held under the conditions of a heating temperature of 80 to 150° C. and a heating time period of 1 to 10 minutes.

According to the ninth aspect of the present invention, the closed container is provided with at least two spaces partitioned by a partitioning member, the mounting substrate mounted with the SAW chip and having the resin sheet placed on the upper face of the SAW chip is disposed in a first space of the at least two spaces and atmosphere in the first space is kept in a reduced or vacuum state, and the resin sheet is pressurized onto the SAW chip by opening atmosphere in a second space of the at least two spaces to the atmospheric pressure to press the partitioning member toward the first space in the laminating step.

According to the tenth aspect of the present invention, the closed container is provided with at least two spaces partitioned by a partitioning member, the mounting substrate mounted with the SAW chip and having the resin sheet placed on the upper face of the SAW chip is disposed in a first space of the at least two spaces and atmosphere in the first space is kept in a reduced or vacuum state, and the resin sheet is pressurized onto the SAW chip by applying pressure larger than the atmospheric pressure to atmosphere in a second space of the at least two spaces to press the partitioning member toward the first space in the laminating step.

According to the eleventh aspect of the present invention, a surface of the partitioning member is constituted of an elastic member in the laminating step.

According to the twelfth aspect of the present invention, the partitioning member is a flat plate in the laminating step.

According to the thirteenth aspect of the present invention, the press forming step is performed simultaneously with the laminating step.

According to the fourteenth aspect of the present invention, the press forming step and the post-curing step are performed simultaneously with the laminating step According to the fifteenth aspect of the present invention, in the laminating step, an annular frame having an opening equal to or larger than a region where the SAW chip has been mounted is provided on an upper face of the resin sheet, and after the annular frame is provided, the laminating step is performed.

According to the sixteenth aspect of the present invention, a wall member having the same height as the SAW chip is disposed on an outer peripheral portion about a region where the SAW chip of the mounting substrate has been mounted on the mounting substrate.

According to the seventeenth aspect of the present invention, the laminating step is performed after a flat plate having an area equal to or larger than a region where the SAW chip has been mounted is disposed on an upper face of the resin sheet in the laminating step.

According to the eighteenth aspect of the present invention, a frame member is provided on the mounting substrate so as to overlap with a peripheral portion of the SAW chip and a thickness of the frame member is in a range of 10 μm or more to 30 μm or less.

According to the nineteenth aspect of the present invention, a dam is provided on an outer peripheral portion of the SAW chip except for a SAW oscillating portion on the SAW chip and a thickness of the dam is in a range of 10 μm or more to 30 μm or less.

According to the twentieth aspect of the present invention, a dam is provided on an outer peripheral portion of the SAW chip except for a SAW oscillating portion on the SAW chip, a frame member is provided on the mounting substrate substantially at the same position as the dam, and a sum of thicknesses of the dam and the frame member is 30 μm or less.

According to the twenty-first aspect of the present invention, in the method for manufacturing a SAW device of any one of the eighteenth to twentieth aspect of the present invention, at least one of the frame member and the dam is made from photosensitive resin.

According to the twenty-second aspect of the present invention, a region of the mounting substrate except for the connection pad portion on the mounting substrate is covered with an insulating layer, and a thickness of the insulating layer is in a range of 10 μm or more to 30 μm or less.

According to the twenty-third aspect of the present invention, a height of the connection pad formed on the mounting substrate is lowered relative to a region of the mounting substrate except for the connection pad by 10 to 30 μm.

According to the twenty-third aspect of the present invention, the mounting substrate has a structure in which a plurality of individual mounting substrates are continuously integrated, and a step of dicing the mounting substrate into the individual mounting substrates is included.

BEST MODE FOR CARRYING OUT THE INVENTION

Figure 1:
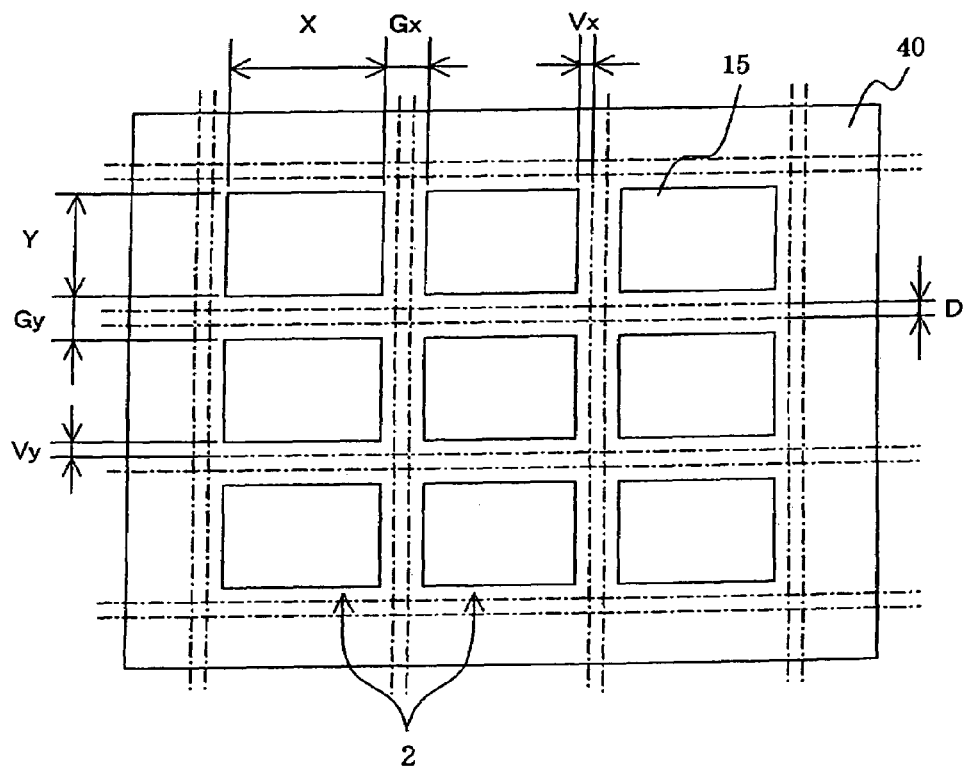
FIGS. 1(a) and 1(b) are a plan view and a sectional view showing a flip-chip mounting step of a SAW device according to the present invention.
Figure 1:
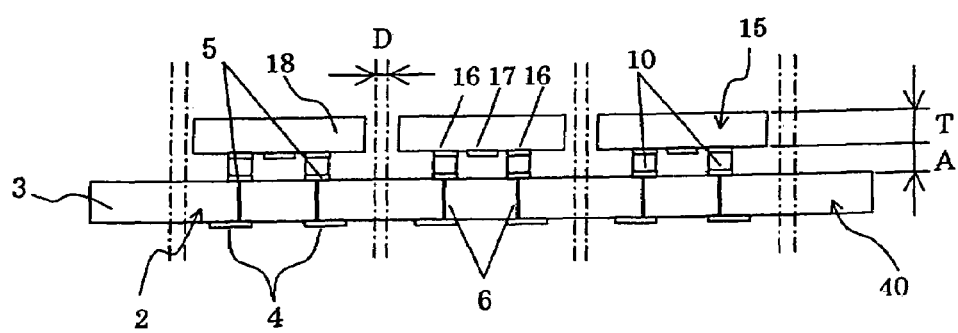

The present invention will be explained in detail below according to embodiments shown in the drawings.

FIG. 1(a) to FIG. 6 are views showing a method for manufacturing a SAW device according to an embodiment of the present invention. First, FIGS. 1(a) and 1(b) are a plan view and a sectional view showing a step of flip-chip mounting SAW chips 15 on a mounting substrate base material 40 having a structure in which mounting substrates 2 are coupled to one another into a sheet-like shape. The mounting substrate 2 has external electrodes 4 for surface mounting on a bottom portion of an insulating substrate 3 and connection pads 5 for electrical conduction with the SAW chip 15 on an upper portion thereof. The mounting substrate 2 is provided therein with internal conductors 6 for electrical conduction between the external electrode 4 and the connection pad 5. Further, the SAW chip 15 is provided on a main face of a piezoelectric substrate 18 thereof with an IDT 17 for oscillating a SAW and connection pads 16 electrically conducted with the IDT 17. A flip-chip mounting is performed by connecting the connection pads 5 on the mounting substrate 2 and the connection pads 16 on the SAW chip 15 using conductive bumps 10.

Figure 2:
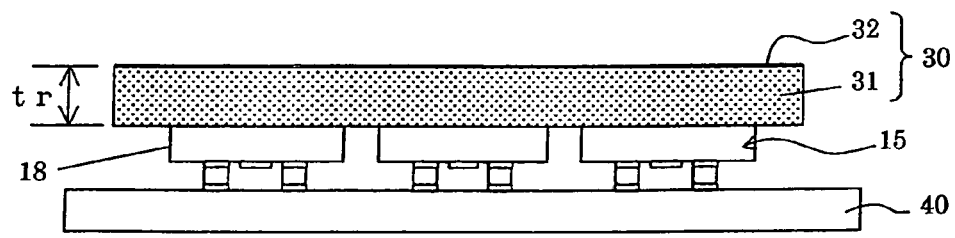
FIG. 2 is a view showing a step of placing a resin sheet of the SAW device according to the present invention on a SAW chip.

Next, a step of placing a resin sheet 30 over upper faces of the SAW chips 15 mounted on the mounting substrate base material 40 shown in FIG. 1 is shown in FIG. 2. The resin sheet 30 has a protective film 32 with releasing property detachably adhered to one face of a resin sheet member 31 with adherence. For example, polyethylene terephthalate (PET) or the like can be used as the protective film.

When a thickness of the resin sheet member 31 is represented as tr, tr is set to satisfy the following conditions.

$$L/\{(X+Gx)(Y+Gy)\} \leq tr,$$

wherein $L=(X+Gx)(Y+Gy)(H+T+A)-XYT-XYA-\{XVyA+Yvx+(4VxVyA)/3\}$

In the equation, L represents a volume of a resin sheet required for sealing an outer face of one SAW chip, X represents a length of one side of a SAW chip, Y represents a length of another side of the SAW chip, Gx represents a spacing between SAW chips adjacent to each other in X direction, Vx represents a distance from a dicing margin extending in Y direction to a side face of a SAW chip nearest thereto, Gy represents a spacing between SAW chips adjacent to each other in the Y direction, Vy represents a distance from a dicing margin extending in the X direction to a side face of a SAW chip nearest thereto, H represents a thickness of resin positioned on an upper face of a SAW chip after an outer face of one SAW chip is covered with a resin sheet, T represents a thickness of a piezoelectric substrate, and A represents a spacing from an upper face of a mounting substrate base material to a bottom face of the piezoelectric substrate.

By setting the thickness of the resin sheet member 31 as described above, such a possibility of creation of a hole in an air tight space due to insufficient thickness of the resin leading to reduction in dust resistance and moisture resistance of the SAW device after the resin is laminated on the SAW chip can be eliminated.

Figure 3:
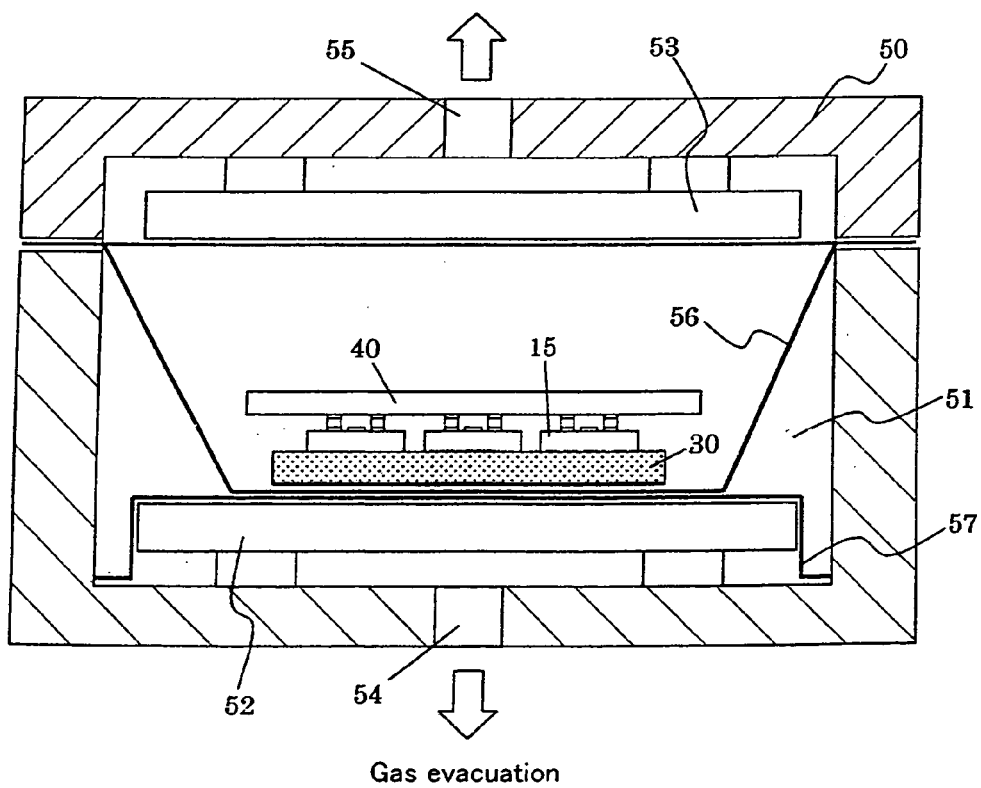
FIG. 3 is a view showing a vacuuming step of the SAW device according to the present invention.

Next, a step of disposing the resin sheet 30 temporarily adhered to the respective SAW chips 15 in a closed device 50 and performing vacuuming is shown in FIG. 3. The closed device 50 is provided inside a chamber 51 with a bottom portion heat source 52 and an upper portion heat source 53, and a bottom portion exhaust port 54 and an upper portion exhaust port 55. The closed device 50 has a structure in which a conveying film 56 for conveying SAW devices is provided between the bottom portion heat source 52 and the upper portion heat source 53 and a diaphragm 57 made of an elastic member is spanned in a clearance between the conveying film 56 and the bottom portion heat source 52. In this step, the mounting substrate base material 40 in which the resin sheet 30 has been placed on the SAW chips 15 is first disposed in the conveying film 56, interior of the chamber 51 is heated by the bottom portion heat source 52 and the upper portion heat source 53, and the interior of the chamber 51 is vacuumed by evacuating air therein through the bottom portion exhaust port 54 and the upper portion exhaust port 55. Then, after the chamber 51 becomes a vacuum state, the vacuum state is maintained.

Figure 4:
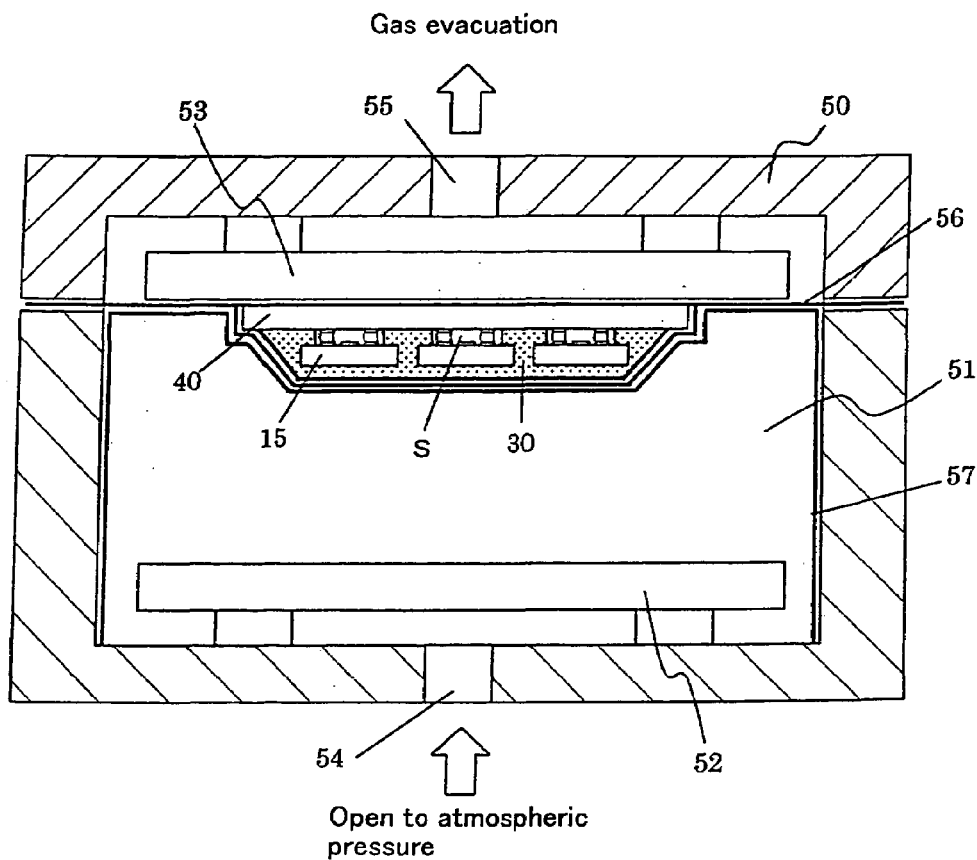
FIG. 4 is a view showing a laminating step and a press forming step for the SAW device according to the present invention.

Next, a step of laminating the resin sheet 30 on outer faces of the SAW chips 15 is shown in FIG. 4. First, after the resin sheet 30 becomes an optimal softened state by heating the sheet at a temperature of 80 to 150° C. for 1 to 10 minutes by the upper portion heat source 53 until the resin sheet 30 is gelated, opening to the atmospheric pressure is conducted through the bottom portion exhaust port 54 while performing heating. At that time, the upper portion exhaust port 55 side is maintained in the vacuum state. The diaphragm 57 expands due to opening to the atmospheric pressure and the softened resin sheet 30 is pressurized toward the mounting substrate base material 40. Then, the resin sheet 30 is filled on outer faces of the SAW chips 15 and on the upper face of the mounting substrate base material 40 by pressurization. While in the embodiment, the resin sheet 30 is pressurized by opening to the atmospheric pressure, the resin sheet 30 may be pressurized by applying a pressure larger than the atmospheric pressure to the resin sheet 30. Further, while in the laminating step, the resin sheet is pressurized onto the SAW chip by expanding the diaphragm, a flat plate or another pressing unit may be used instead of the diaphragm. In this case, the resin sheet is filled on the outer faces of the SAW chips and the upper face of the mounting substrate base material by applying a pressure due to opening to the atmospheric pressure or applying a pressure larger than the atmospheric pressure onto a flat plate or the like to press the flat plate onto the resin sheet.

Since the resin after the laminating step is soft, when heating is merely performed at a resin curing temperature, air inside an airtight space S inflates to push out the resin and the airtight space expands beyond necessity, so that the resin must be press-formed. In the press forming step, by maintaining heating and pressurizing states to the SAW chips 15 and the mounting substrate base material 40 laminated with resin in the laminating step, the diaphragm 57 deforms along the outer faces of the SAW chips 15 and the upper face of the mounting substrate base material 40 and comes in close contact with the resin to press the resin, so that the resin can be formed and cured while maintaining the airtight space S.

Figure 5:
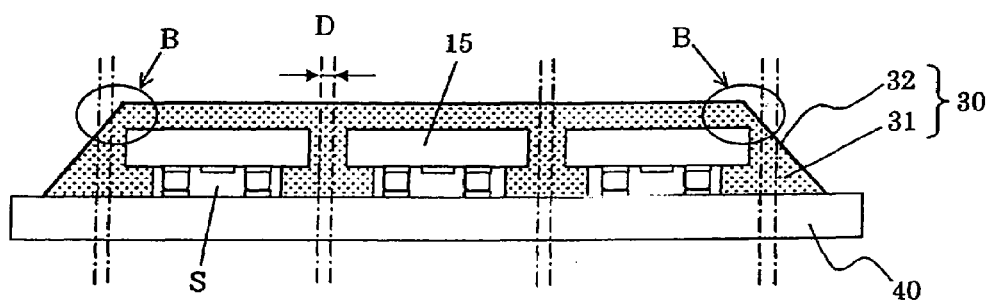
FIG. 5 is a view showing a state of the SAW device according to the present invention after a post-curing step.
Figure 6:
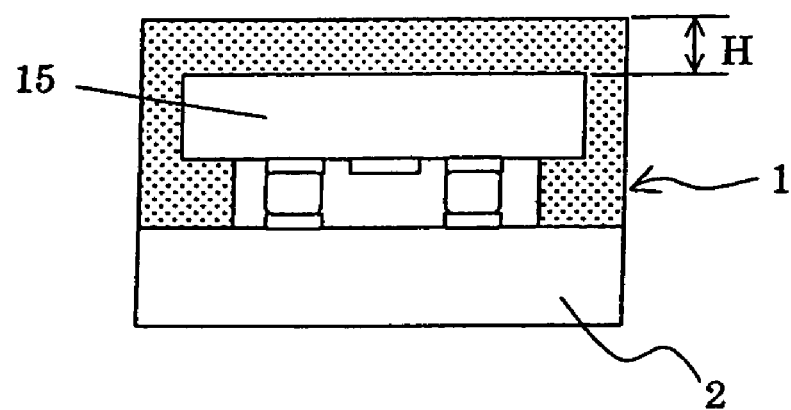
FIG. 6 is a view showing a state of the SAW device according to the present invention after a dicing step.

After the press forming step is terminated, the manufacturing method proceeds to a post-curing step. The post-curing step is a step of performing heating at a temperature and for a time period in which the resin cures completely. After the press forming step, heating is performed at the resin curing temperature while keeping the state shown in FIG. 4. When the resin cures completely, the interior of the chamber is returned back to the atmospheric pressure and the mounting substrate base material 40 is taken out of the closed device 50. Thus, as shown in FIG. 5, the resin completely seals over the outer faces of the SAW chips 15 and the upper face of the mounting substrate base material 40. An individual SAW device 1 as shown in FIG. 6 is completed by peeling off the protective film 32 and dicing the mounting substrate base material 40 along dicing margins D shown in FIG. 5 using a dicing blade. In the post-curing step, after gelation of the resin is completed, the mounting substrate base material may be taken out of the chamber, and the mounting substrate base material may be disposed in a thermostatic chamber, so as to cure the resin by performing heating at a temperature and for a time period in which the resin cures completely.

As described above, according to the present invention, in the manufacturing method for resin-sealing a SAW chip, there is an advantage that a high quality SAW device with excellent mass productivity because the laminating step to the post-curing step can be consistently performed in the same apparatus without using another apparatus, and with excellent moisture resistance and air tightness because the resin is made sufficiently thick so as not to expose the SAW chip and to firmly protect the SAW chip, can be provided.

In the manufacturing steps of the present invention, a manufacturing procedure of first flip-chip mounting the SAW chips on the mounting substrate base material to dispose the mounting substrate base material in the chamber in such a state that resin sheet is placed on upper faces of the SAW chips, and then setting the interior of the chamber to a vacuum state and opening the interior to the atmospheric pressure to pressurize the resin onto outer faces of the SAW chips, thereby laminating the resin on the SAW chips has been explained, but other procedures can be adopted.

Figure 7:
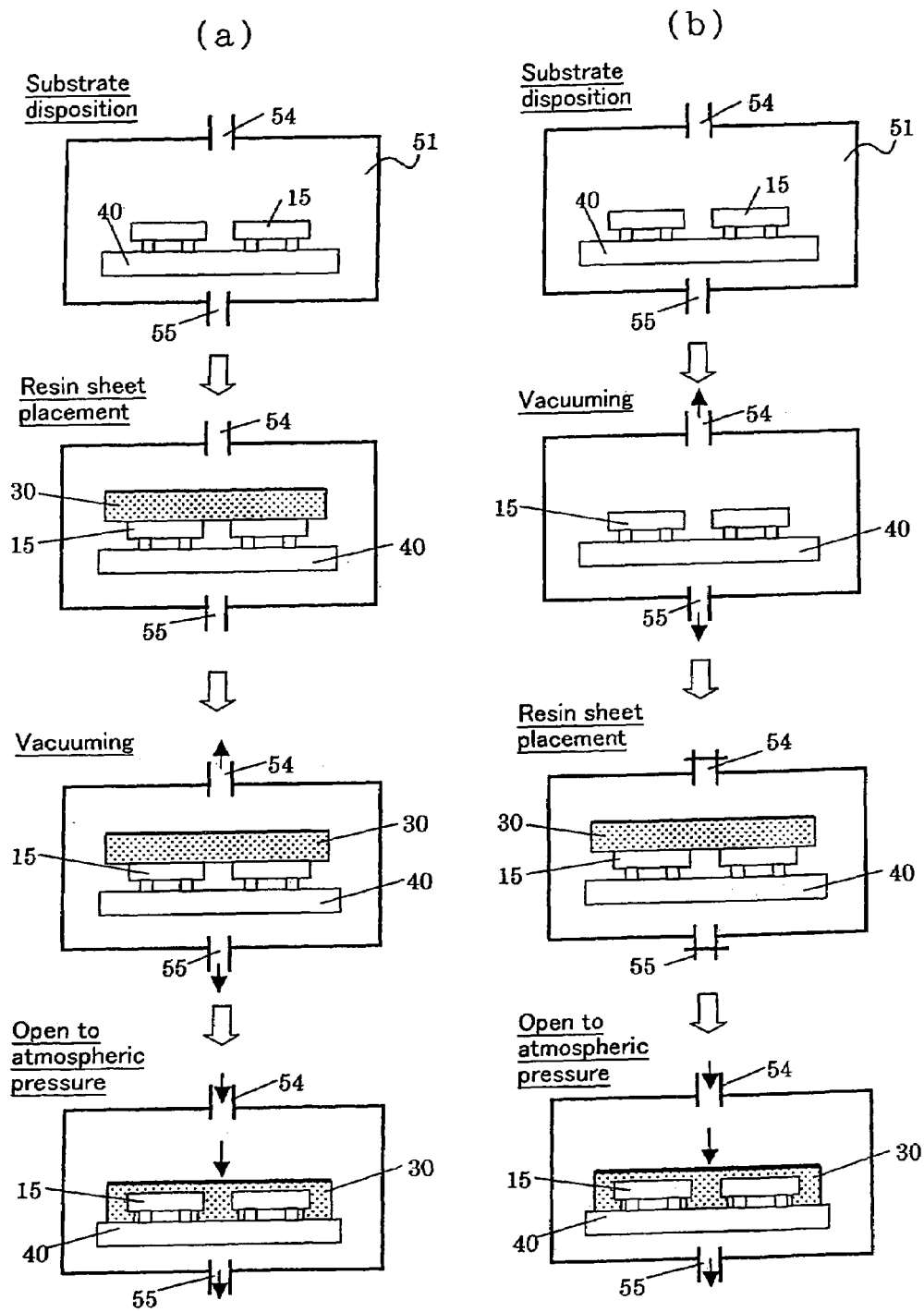
FIGS. 7(a) and 7(b) are views showing different manufacturing procedures of the SAW device according to the present invention.

Other manufacturing procedures will be explained below with reference to FIGS. 7(a) and 7(b). FIGS. 7(a) and 7(b) are views schematically illustrating a substrate disposition to opening to the atmospheric pressure in the laminating step according to the present invention. FIG. 7(a) shows a procedure of, after disposing the mounting substrate base material 40 on which the SAW chips 15 have been mounted in the chamber 51, attaching the resin sheet 30 over upper faces of the respective SAW chips 15, heating the interior of the chamber to evacuate gas through the exhaust ports 54 and 55 and to set the interior to a vacuum state, and opening the interior of the chamber to the atmospheric pressure through the exhaust port 54 while softening the resin sheet 30, thereby pressurizing the resin sheet 30 onto the SAW chips 15.

A manufacturing procedure shown in FIG. 7(b) is a procedure of disposing the mounting substrate base material 40 on which the SAW chips 15 have been mounted in the chamber 51, attaching the resin sheet 30 on upper faces of the SAW chips 15 after evacuating gas through the exhaust ports 54 and 55 to set the interior of the chamber 51 to a vacuum state, and opening the interior of the chamber to the atmospheric pressure through the exhaust port 54 while softening the resin sheet 30, thereby pressurizing the resin sheet 30 onto the SAW chips 15.

In the manufacturing methods shown in the embodiment and in FIGS. 7(a) and 7(b), before the interior of the chamber is set to the vacuum state, atmosphere in the chamber may be replaced with inert gas. Since the airtight space after completion of resin sealing is filled with the inert gas, the SAW device can be prevented from deteriorating with time and electric characteristics thereof can be maintained over years.

In the laminating step of the present invention, since a pressure of the diaphragm at a laminating time is applied such that a pressure acting on the SAW chips positioned at the outermost peripheral portions of the mounting substrate base material is larger than a pressure acting on the SAW chips positioned at a central portion thereof, there is a possibility that the amount of resin is reduced at portions B shown in FIG. 5, i.e., at corners of the SAW chips positioned at the outermost peripheral portions of the mounting substrate base material, so that the SAW chips are exposed to the outside.

Figure 8:
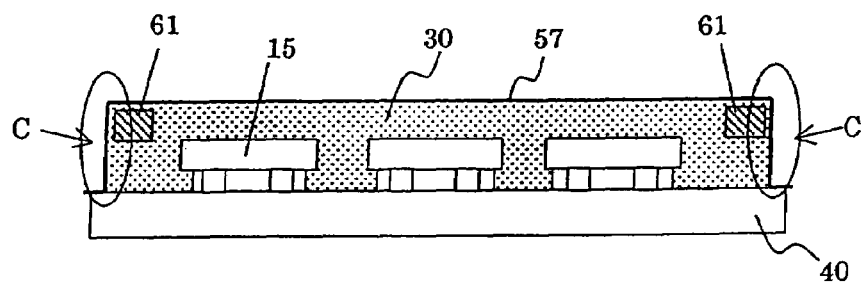
FIGS. 8(a) to 8(c) are enlarged views of a mounting substrate base material at a time of a laminating step for a SAW device according to a second embodiment of the present invention.
Figure 8:
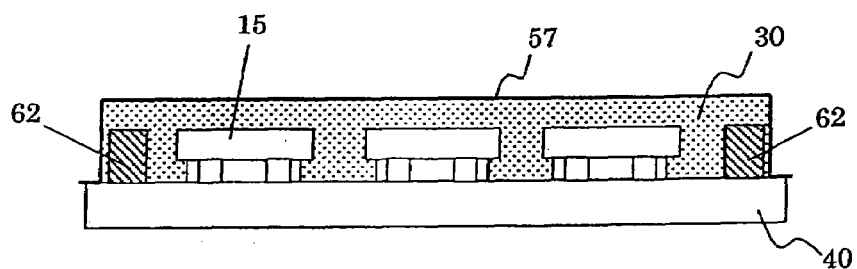
Figure 8:
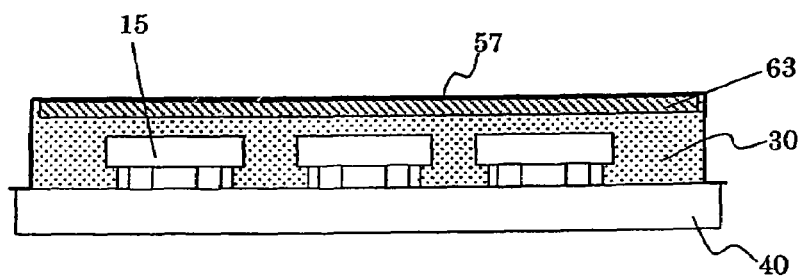

A second embodiment according to the present invention is shown in FIG. 8 in order to improve the above problem. FIGS. 8(a), 8(b), and 8(c) are enlarged views of a mounting substrate base material during a laminating step. FIG. 8(a) shows a state obtained by, after flip-chip mounting the SAW chips 15 on the mounting substrate base material 40, attaching the resin sheet 30 over upper faces of the respective SAW chips 15 and further providing an annular frame 61 on the resin sheet 30 to perform a laminating step. The annular frame 61 has a thickness thinner than or approximately equal to a thickness of the SAW chip 15, and is arranged so as to surround the SAW chips 15 mounted on the mounting substrate base material 40. After the annular frame 61 is disposed, the mounting substrate base material 40 is disposed in the chamber and the laminating step is performed. In this embodiment, since the annular frame 61 is provided on the resin sheet 30, there is an advantage that deformation of the diaphragm 57 due to pressurization in the laminating step can be made orthogonal at portions C shown in FIG. 8(a), so that a thickness of the resin can be secured regardless of a mounting portion on the mounting substrate base material. Instead of the structure shown in FIG. 8(a), a structure in which a wall member 62 having a thickness approximately equal to that of the SAW chip 15 is provided at an outer peripheral portion of the mounting substrate base material 40, as shown in FIG. 8(b), or a flat plate 63 having an area equal to or larger than a region on which the SAW chips 15 have been mounted is placed on the resin sheet 30, as shown in FIG. 8(c) may be adopted. In either structure, decrease in the amount of the resin of the SAW chip at the outermost peripheral portions of the mounting substrate base material can be suppressed, so that exposure of the SAW chip to the outside can be prevented.

As described above, according to the present embodiment, there is an advantage that the SAW chip can be protected by resin with a sufficient thickness during the laminating step, regardless of the mounting portion of the SAW chip on the mounting substrate base material, can be achieved.

Figure 9:
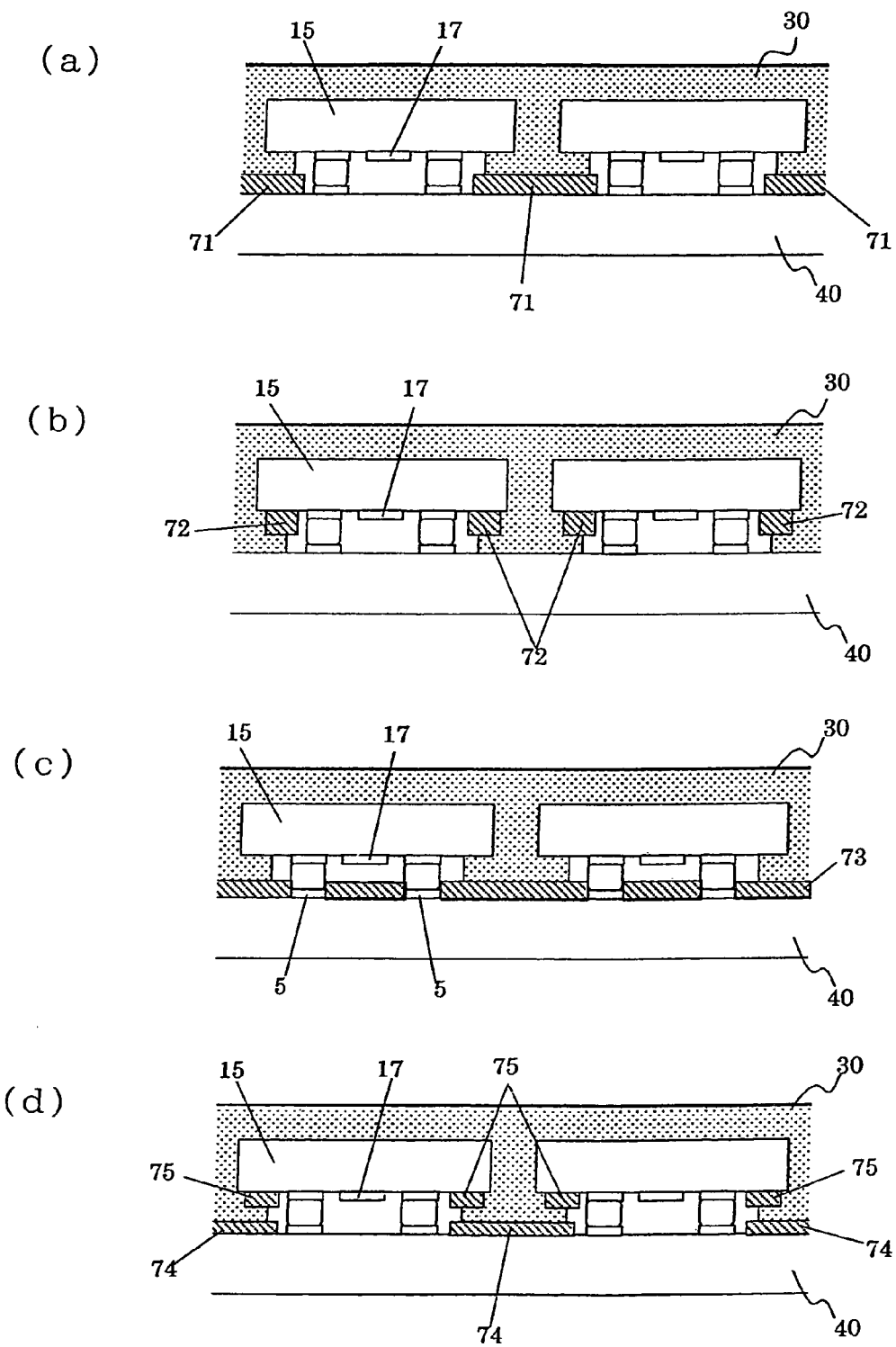
FIGS. 9(a) to 9(d) are enlarged views of a mounting substrate base material at a time of a laminating step for a SAW device according to a third embodiment of the present invention.
Figure 10:
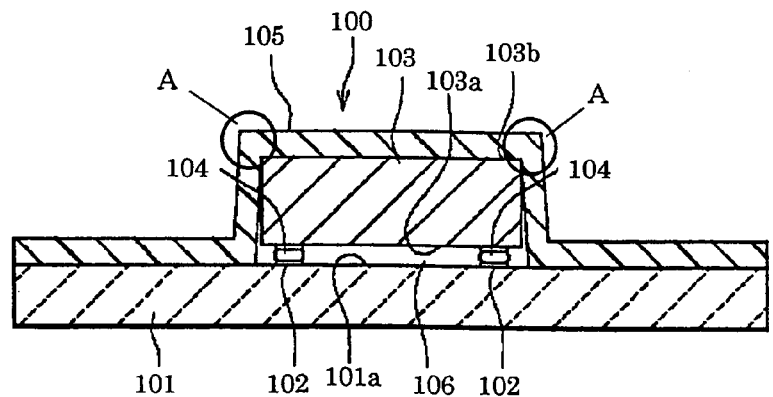
FIG. 10 is a view showing a structure of a conventional SAW device.
Figure 11:
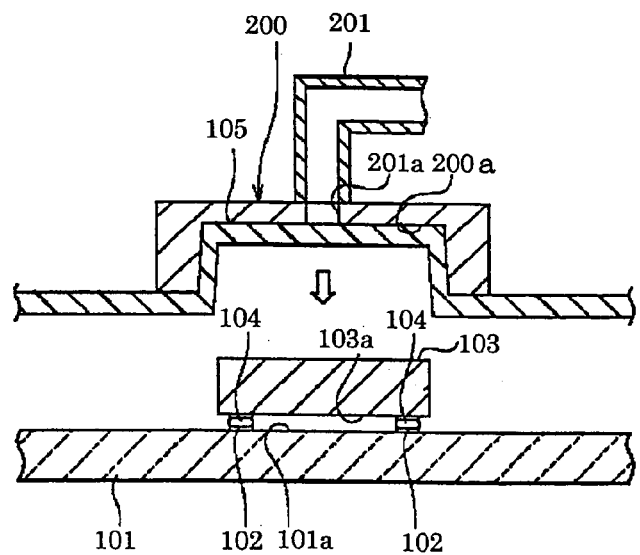
FIG. 11 is a view showing a structure of a second conventional SAW device.

According to the present invention, there is a possibility that the resin intrudes into the airtight space S at a time of pressurization during the laminating step. This is because the degree of resin intrusion into the airtight space becomes larger than a case that resin is laminated under the atmospheric pressure, since the laminating step is performed under a vacuum state. Therefore, a third embodiment according to the present invention is shown in FIGS. 9(a) to 9(d) in order to address the problem. FIGS. 9(a) to 9(d) show enlarged views of a mounting substrate base material during a laminating step. FIG. 9(a) shows a structure in which frame members 71 are provided around respective individual SAW chips 15 of the mounting substrate base material 40. The frame member 71 is formed from alumina or the like so as to overlap with a peripheral portion of the SAW chip 15 and has a thickness thinner than a gap between the SAW chip 15 and the mounting substrate base material 40. By providing the frame member 71 in this manner, resin can be prevented from intruding into the airtight space during the laminating step. Specifically, when a thickness of the frame member 71 is set to a range of 10 μm or more to 30 μm or less, resin intrusion can be prevented further securely.

Besides the above-described structure, structures as shown in FIGS. 9(b) to 9(d) may be adopted in order to prevent resin intrusion into the airtight space. FIG. 9(b) shows a structure in which dams 72 are provided on a mounting face of the SAW chip 15. The dam 72 is formed from photosensitive resin or the like so as to surround an outer peripheral portion of the SAW chip 15 except for a portion thereof where the IDT 17 has been formed, and has a thickness thinner than a gap between the SAW chip 15 and the mounting substrate base material 40. Specifically, the thickness of the dam 72 is set to a range of 10 μm or more to 30 μm or less. FIG. 9(c) shows a structure in which a region on the mounting substrate base material 40 except for the connection pads 5 is covered with an insulating layer 73 made from alumina or the like. The insulating layer 73 has a thickness thinner than a gap between the SAW chip 15 and the mounting substrate base material 40. Specifically, the thickness of the insulating layer 73 is set to a range of 10 μm or more to 30 μm or less. Furthermore, FIG. 9(d) shows a structure in which frame members 74 are provided so as to overlap with peripheral portions of respective individual SAW chips 15 on the mounting substrate base material 40 and dams 75 are formed so as to surround outer peripheral portions of the SAW chips 15 except for portions where the IDT 17 has been formed. The frame member and the dam are disposed so as to approximately overlap with each other, and a sum of the thicknesses of the frame member 74 and the dam 75 is set to be smaller than a gap between the SAW chip and the mounting substrate base material. Specifically, the sum of the thicknesses of the frame member 72 and the dam is set to 30 μm or less.

In the above explanation, an example in which the dam is formed from photosensitive resin and the frame member is formed with an insulator made from alumina or the like is described. However, the present invention is not limited to this example, and both the dam and the frame member may be formed from photosensitive resin or metal, or an inorganic material of the insulator.

In the embodiment, provision of the frame member on the mounting substrate base material or provision of the dam on the SAW chip achieves an advantage of preventing the resin from entering into the airtight space required for oscillating the SAW during the laminating step.

As explained above, according to the present invention, in the method for manufacturing a SAW chip in which the SAW chip is flip-chip mounted on the mounting substrate and the SAW device is sealed with resin, since a resin sealing step can be performed consistently and it is unnecessary to prepare jigs corresponding to respective device sizes, mass productivity is excellent. Further, since the area of the bottom face of the mounting substrate of the SAW device and the area of the upper face of the SAW chip are equal to each other, marking for filter identification or device pickup can be performed easily. Since firm protection is achieved by sealing the SAW chip with a sufficiently thick resin regardless of a position of the SAW chip mounted on the mounting substrate, damage of the SAW chip and exposure of the outer face of the SAW chip can be prevented, and a SAW device excellent in air tightness and moisture resistance can be provided.

The invention claimed is:

1. A method for manufacturing a surface acoustic wave (SAW) device in which a surface acoustic wave chip is flip-chip mounted on a mounting substrate and an airtight space is formed by sealing an outer face of the SAW chip using resin, comprising:

a step of flip-chip mounting an electrode pad provided on the SAW chip and a connection pad provided on the mounting substrate using a conductive bump;

a step of placing a resin sheet on an upper face of the SAW chip mounted on the mounting substrate;

a laminating step of disposing, in a closed container, the mounting substrate on which the SAW chip is mounted and which has the resin sheet mounted on the upper face of the SAW chip, and covering the outer face of the SAW chip while securing the airtight space by pressurizing the resin sheet while heating the resin sheet;

a press forming step of curing the resin while maintaining the airtight space by maintaining pressurized and heated state in the laminating step; and a post-curing step of performing heating at a temperature and for a time in which the resin completely cures, wherein in the laminating step, the closed container is partitioned to at least two spaces by a partitioning member, the mounting substrate on which the SAW chip is mounted and which has the resin sheet placed on the upper face of the SAW chip is disposed in a first space of the at least two spaces, and atmosphere in the first space is maintained in a pressure-reduced or vacuum state, and the resin sheet is pressurized toward the mounting substrate by applying a pressure from the side of a second space of the at least two spaces to press the partitioning member toward the first space side, and a thickness tr of the resin sheet in the laminating step satisfies an equation of $$L/\{(X+Gx)(Y+Gy)\} \leq tr, \text{ where}$$

$$L = (X+Gx)(Y+Gy)(H+T+A) - XYT - XYA - \{XVy + YxA + (4VxVyA)/3\},$$

in which L represents a volume of a resin sheet required for sealing an outer face of one SAW chip, X represents a length of one side of a SAW chip, Y represents a length of another side of the SAW chip, Gx represents a spacing between SAW chips adjacent to each other in X direction, Vx represents a distance from a dicing margin extending in Y direction to a side face of a SAW chip nearest thereto, Gy represents a spacing between SAW chips adjacent to each other in the Y direction, Vy represents a distance from a dicing margin extending in the X direction to a side face of a SAW chip nearest thereto, H represents a thickness of resin positioned on an upper face of a SAW chip after an outer face of one SAW chip is covered with a resin sheet, T represents a thickness of a piezoelectric substrate, and A represents a spacing from an upper face of a mounting substrate to a bottom face of the piezoelectric substrate.

2. The method for manufacturing a SAW device according to claim 1, wherein the resin sheet has a structure in which a protective film with releasing property has been adhered onto an upper face of a sticky resin sheet member, the respective steps are conducted in a state that a lower face of the resin sheet member is placed on the upper face of the SAW chip, and the protective film is peeled off before the post-curing step or after the post-curing step.

3. The method for manufacturing a SAW device according to claim 2, wherein the protective film is made from polyethylene terephthalate (PET).

4. The method for manufacturing a SAW device according claim 1, wherein the laminating step includes procedures of:

(1) after placing the resin sheet on the SAW chip mounted on the mounting substrate, placing it in a closed container; and (2) after the procedure (1), evacuating gas in the closed container to make the closed container become a pressure-reduced or vacuum state and pressurizing the resin sheet while softening or melting the resin sheet.

5. The method for manufacturing a SAW device according to claim 1, wherein the laminating step includes procedures of:

(1) after placing the mounting substrate mounted with the SAW chip in a closed container, adhering the resin sheet onto the upper face of the SAW chip; and (2) after the procedure (1), evacuating gas in the closed container to make the closed container become a pressure-reduced or vacuum state and pressurizing the resin sheet while softening or melting the resin sheet.

6. The method for manufacturing a SAW device according to claim 1, wherein the laminating step includes procedures of:

(1) after placing the mounting substrate mounted with the SAW chip in a closed container, evacuating gas in the closed container to make the closed container become a pressure-reduced or vacuum state; and (2) after the procedure (1), placing the resin sheet on the SAW chip and pressurizing the resin sheet while softening or melting the resin sheet.

7. The method for manufacturing a SAW device according to claim 1, wherein, before the closed container is put in the pressure-reduced or vacuum state, atmosphere in the closed container is replaced with inert gas in the laminating step.

8. The method for manufacturing a SAW device according to claim 1, wherein pressurization of the resin sheet is performed in the laminating step until the resin sheet is gelated, that is, the pressurizing is performed after the resin sheet is held under the conditions of a heating temperature of 80 to 150° C. and a heating time period of 1 to 10 minutes.

9. The method for manufacturing a SAW device according to claim 1, wherein the closed container is provided with at least two spaces partitioned by a partitioning member, the mounting substrate mounted with the SAW chip and having the resin sheet placed on the upper face of the SAW chip is disposed in a first space of the at least two spaces and atmosphere in the first space is kept in a reduced or vacuum state, and the resin sheet is pressurized onto the SAW chip by opening atmosphere in a second space of the at least two spaces to the atmospheric pressure to press the partitioning member toward the first space in the laminating step.

10. The method for manufacturing a SAW device according to claim 1, wherein the closed container is provided with at least two spaces partitioned by a partitioning member, the mounting substrate mounted with the SAW chip and having the resin sheet placed on the upper face of the SAW chip is disposed in a first space of the at least two spaces and atmosphere in the first space is kept in a reduced or vacuum state, and the resin sheet is pressurized onto the SAW chip by applying pressure larger than the atmospheric pressure to atmosphere in a second space of the at least two spaces to press the partitioning member toward the first space in the laminating step.

11. The method for manufacturing a SAW device according to claim 1, wherein a surface of the partitioning member is constituted of an elastic member in the laminating step.

12. The method for manufacturing a SAW device according to claim 1, wherein the partitioning member is a flat plate in the laminating step.

13. The method for manufacturing a SAW device according to claim 1, wherein the press forming step is performed simultaneously with the laminating step.

14. The method for manufacturing a SAW device according to claim 1, wherein the press forming step and the post-curing step are performed simultaneously with the laminating step.

15. The method for manufacturing a SAW device according to claim 1, wherein, in the laminating step, an annular frame having an opening equal to or larger than a region where the SAW chip has been mounted is provided on an upper face of the resin sheet, and after the annular frame is provided, the laminating step is performed.

16. The method for manufacturing a SAW device according to claim 1, wherein a wall member having the same height as the SAW chip is disposed on an outer peripheral portion about a region where the SAW chip of the mounting substrate has been mounted on the mounting substrate.

17. The method for manufacturing a SAW device according to claim 1, wherein the laminating step is performed after a flat plate having an area equal to or larger than a region where the SAW chip has been mounted is disposed on an upper face of the resin sheet in the laminating step.

18. The method for manufacturing a SAW device according to claim 1, wherein a frame member is provided on the mounting substrate so as to overlap with a peripheral portion of the SAW chip and a thickness of the frame member is in a range of 10 μm or more to 30 μm or less.

19. The method for manufacturing a SAW device according to claim 1, wherein a dam is provided on an outer peripheral portion of the SAW chip except for a SAW oscillating portion on the SAW chip and a thickness of the dam is in a range of 10 μm or more to 30 μm or less.

20. The method for manufacturing a SAW device according to claim 1, wherein a dam is provided on an outer peripheral portion of the SAW chip except for a SAW oscillating portion on the SAW chip, a frame member is provided on the mounting substrate substantially at the same position as the dam, and a sum of thicknesses of the dam and the frame member is 30 μm or less.

21. The method for manufacturing a SAW device according to any one of claims 18 to 20, wherein at least one of the frame member and the dam is made from photosensitive resin.

22. The method for manufacturing a SAW device according to claim 1, wherein a region of the mounting substrate except for the connection pad portion on the mounting substrate is covered with an insulating layer, and a thickness of the insulating layer is in a range of 10 μm or more to 30 μm or less.

23. The method for manufacturing a SAW device according to claim 1, wherein a height of the connection pad formed on the mounting substrate is lowered relative to a region of the mounting substrate except for the connection pad by 10 to 30 μm.

24. The method for manufacturing a SAW device according to claim 1, wherein the mounting substrate has a structure in which a plurality of individual mounting substrates are continuously integrated, and a step of dicing the mounting substrate into the individual mounting substrates is included.

* * * * *